US012096695B2

(12) United States Patent
Hirose et al.

(10) Patent No.: US 12,096,695 B2
(45) Date of Patent: Sep. 17, 2024

(54) PIEZOELECTRIC ELEMENT, PIEZOELECTRIC ACTUATOR, AND PIEZOELECTRIC TRANSFORMER

(71) Applicant: TDK CORPORATION, Tokyo (JP)

(72) Inventors: Yuiko Hirose, Tokyo (JP); Hiroki Katoh, Tokyo (JP); Yumi Akiyama, Tokyo (JP)

(73) Assignee: TDK CORPORATION, Tokyo (JP)

( * ) Notice: Subject to any disclaimer, the term of this patent is extended or adjusted under 35 U.S.C. 154(b) by 791 days.

(21) Appl. No.: 17/213,573

(22) Filed: Mar. 26, 2021

(65) Prior Publication Data

US 2021/0305484 A1 Sep. 30, 2021

(30) Foreign Application Priority Data

Mar. 27, 2020 (JP) .................................. 2020-057901

(51) Int. Cl.
| | |
|---|---|
| *H10N 30/50* | (2023.01) |
| *H10N 30/045* | (2023.01) |
| *H10N 30/053* | (2023.01) |
| *H10N 30/20* | (2023.01) |
| *H10N 30/40* | (2023.01) |
| *H10N 30/853* | (2023.01) |
| *H10N 30/87* | (2023.01) |

(52) U.S. Cl.
CPC ........... *H10N 30/50* (2023.02); *H10N 30/045* (2023.02); *H10N 30/053* (2023.02); *H10N 30/20* (2023.02); *H10N 30/40* (2023.02); *H10N 30/8542* (2023.02); *H10N 30/8554* (2023.02); *H10N 30/871* (2023.02); *H10N 30/877* (2023.02)

(58) Field of Classification Search
CPC .. H10N 30/50; H10N 30/8542; H10N 30/045; H10N 30/40; H10N 30/871; H10N 30/053; H10N 30/20; H10N 30/877; H10N 30/8554

See application file for complete search history.

(56) References Cited

U.S. PATENT DOCUMENTS

| 6,387,295 | B1 | 5/2002 | Saito | |
| 2002/0098333 | A1* | 7/2002 | Feltz | H10N 30/8554 |
| | | | | 428/617 |
| 2002/0149901 | A1 | 10/2002 | Shindo et al. | |
| 2003/0163908 | A1* | 9/2003 | Kaji | H04R 17/00 |
| | | | | 29/25.35 |
| 2004/0050477 | A1 | 3/2004 | Shindo et al. | |
| 2004/0169442 | A1* | 9/2004 | Senoo | H10N 30/057 |
| | | | | 310/328 |

(Continued)

FOREIGN PATENT DOCUMENTS

| DE | 10164354 A1 | 8/2002 |
| DE | 10141820 A1 | 3/2003 |

(Continued)

*Primary Examiner* — J. San Martin
(74) *Attorney, Agent, or Firm* — Oliff PLC

(57) ABSTRACT

Provided is a piezoelectric element according to the invention including a stacked body in which a piezoelectric layer and an internal electrode layer are stacked. In addition, the internal electrode layer contains at least one kind of element selected from palladium, nickel, platinum, gold, and silver, and copper, and the content of copper contained in the internal electrode layer is 1 to 50 at % in terms of a copper element.

6 Claims, 5 Drawing Sheets

(56) References Cited

U.S. PATENT DOCUMENTS

| | | | | |
|---|---|---|---|---|
| 2007/0216264 A1* | 9/2007 | Furukawa | .......... | H10N 30/8542 |
| | | | | 310/366 |
| 2011/0101829 A1* | 5/2011 | Dernovsek | ........... | H10N 30/508 |
| | | | | 29/25.35 |
| 2014/0285070 A1* | 9/2014 | Glazunov | .......... | H10N 30/8542 |
| | | | | 252/62.9 PZ |
| 2018/0006209 A1 | 1/2018 | Ottlinger et al. | | |
| 2018/0006210 A1 | 1/2018 | Glazunov et al. | | |
| 2020/0295252 A1* | 9/2020 | Katoh | ................. | C04B 35/6262 |

FOREIGN PATENT DOCUMENTS

| | | |
|---|---|---|
| DE | 102006015042 A1 | 10/2007 |
| DE | 102015101311 A1 | 8/2016 |
| JP | 2000-313664 A | 11/2000 |
| JP | 2006-108652 A | 4/2006 |
| JP | 2007-027692 A | 2/2007 |
| JP | 2015-502312 A | 1/2015 |
| JP | 2016-001667 A | 1/2016 |
| JP | 2017-092279 A | 5/2017 |

\* cited by examiner

PIEZOELECTRIC ELEMENT, PIEZOELECTRIC ACTUATOR, AND PIEZOELECTRIC TRANSFORMER

TECHNICAL FIELD

The present invention relates to a piezoelectric element in which a piezoelectric layer and an internal electrode layer are laminated to each other, and a piezoelectric actuator and a piezoelectric transformer which include the piezoelectric element.

BACKGROUND

As described in JP 2016-001667 A, there is known a piezoelectric element in which a piezoelectric layer and an internal electrode layer are laminated to each other. In the multilayer piezoelectric element, a displacement amount per unit volume or a drive force per unit volume can be further enlarged in comparison to a non-laminated piezoelectric element.

The multilayer piezoelectric element can be manufactured by various printing method such as offset printing and screen printing. For example, a green chip is obtained by printing conductive paste on a green sheet including piezoelectric ceramic and by laminating a plurality of the green sheets. In addition, the multilayer piezoelectric element is obtained by firing the green chip. At this time, when adhesiveness between the piezoelectric layer and the internal electrode layer is not sufficient, a dielectric loss increases in the obtained piezoelectric element.

SUMMARY

The present invention was attained in view of above situation, and the object is to provide a piezoelectric element being reduced the dielectric loss, and a piezoelectric actuator and a piezoelectric transformer which includes the piezoelectric element.

In order to attain the above object, the piezoelectric element according to the present invention is a piezoelectric element including:
a stacked body including a piezoelectric layer and an internal electrode layer laminated to each other,
wherein the internal electrode layer contains copper and at least one kind of element selected from palladium, nickel, platinum, gold, and silver, and
the content ($C_{IE}$) of copper (Cu) contained in the internal electrode layer is 1 to 50 at % in terms of a copper element.

In the multilayer piezoelectric element, a palladium (Pd) electrode or a silver (Ag)—Pd alloy electrode is typically used as the internal electrode layer. However, in the case of using the above electrode, an improvement of a dielectric loss has been an issue. As a result of a thorough investigation, the present inventors found that adhesiveness between the internal electrode layer and the piezoelectric layer is improved, and the dielectric loss can be reduced, by containing the predetermined amount of Cu in the internal electrode layer.

Preferably, the piezoelectric layer contains copper (Cu), and
the content ($C_{PE}$) of copper contained in the piezoelectric layer is 1.0 to 4.5 mol % in terms of a copper element. In the piezoelectric element of the present invention, since a predetermined amount of Cu is also contained in the piezoelectric layer, the dielectric loss can be reduced and a mechanical quality coefficient Qm can be raised.

Preferably, the content ($C_{LB}$) of copper contained in the stacked body is 1.0 to 5.0 mol % in terms of a copper element.

Here, the "content ($C_{LB}$) of copper contained in the stacked body" represents a ratio of a total amount of substance of Cu to a total amount of substance (number of moles) of the entirety of the stacked body, and the total amount of substance of Cu represents a total sum of the amount of substance of Cu contained in the internal electrode layer and the amount of substance of Cu contained in the piezoelectric layer. That is, the content $C_{LB}$ depends on the content $C_{IE}$ of Cu contained in the internal electrode layer, and not only the content $C_{PE}$ of Cu contained in the piezoelectric layer but also the number of layers laminated in each layer or dimensions of each layer (that is, volume of each layer constituting the stacked body).

In the piezoelectric element of the present invention, since the content $C_{LB}$ of copper contained in the stacked body is within a predetermined range, the dielectric loss further decreases and Qm is further improved.

Preferably, the piezoelectric layer contains a composite oxide having a perovskite structure as a main component, and the composite oxide is lead zirconate titanate or an alkali metal niobate based compound. Since the piezoelectric layer is constituted by the above-described material, piezoelectric characteristics are further improved.

The piezoelectric element according to the present invention can convert mechanical energy and electric energy from each other, and can be widely used in various fields as a piezoelectric device. For example, the piezoelectric element according to the present invention is applicable to a piezoelectric actuator using a inverse piezoelectric effect. In the piezoelectric actuator including the piezoelectric element of the present invention, a minute displacement is obtained with accuracy with respect to an applied voltage, and a response speed is high. Accordingly, the piezoelectric actuator can be used as various electronic devices, for example such as a drive device for optical parts, a head drive device for HDDs, a head drive device for inkjet printers, a drive device for fuel injection valves, and haptics devices. In addition, the piezoelectric element of the present invention is also applicable as a piezoelectric buzzer or a piezoelectric speaker that uses the inverse piezoelectric effect.

In addition, the piezoelectric element according to the present invention is applicable to a sensor that reads a minute force or a minute amount of displacement by using a piezoelectric effect. In addition, since the piezoelectric element according to the present invention has excellent responsiveness, the piezoelectric composition itself or an elastic body joined to the piezoelectric composition can be excited to cause resonance, by applying an AC electric field thereto. According to this, the piezoelectric element of the present invention is applicable to a piezoelectric transformer, an ultrasonic motor, or the like.

It is particularly preferable to use the piezoelectric element according to the present invention as the piezoelectric actuator or the piezoelectric transformer among the above-described uses.

DETAILED DESCRIPTION OF THE PREFERRED EMBODIMENTS

Hereinafter, the invention is described based on the embodiment shown in the accompanying drawings.

Figure 1:
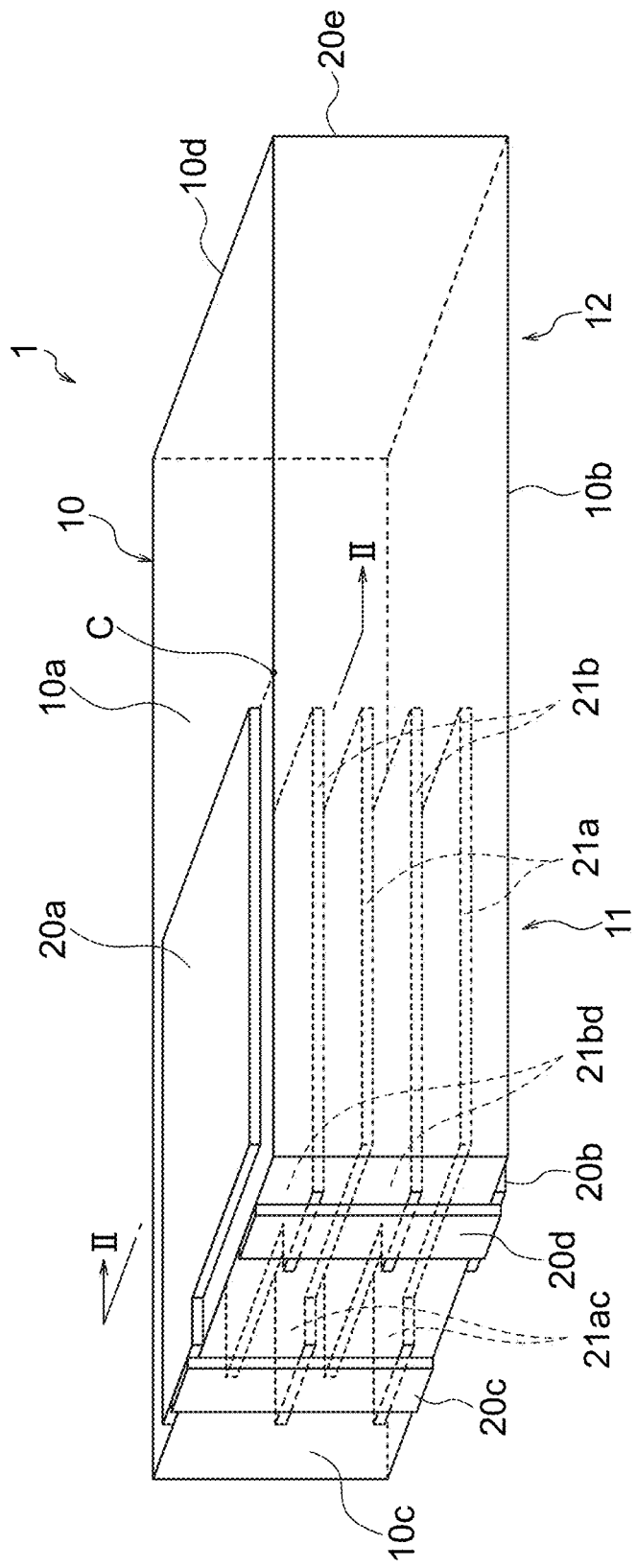
FIG. 1 is a schematic perspective view of a piezoelectric element (piezoelectric transformer) according to an embodiment of the present invention.

In this embodiment, description is given of a piezoelectric transformer 1 shown in FIG. 1 as an example of a piezoelectric device to which a piezoelectric element according to the present embodiment is applied. The piezoelectric transformer 1 is a transformer that transforms and outputs an input AC voltage by using a piezoelectric effect.

As shown in FIG. 1, the piezoelectric transformer 1 includes an element main body 10 (stacked body), and a pair of input electrodes 20a and 20b formed on a pair of opposite surfaces 10a and 10b which are main surfaces of the element main body 10. The element main body 10 has a rectangular planar shape, and a rectangular parallelepiped shape as a whole. However, the shape of the element main body 10 can be arbitrarily set in correspondence with desired characteristics, uses, or the like without particular limitation. In addition, dimensions of the element main body 10 can be arbitrarily set in correspondence with desired characteristics, uses, or the like without particular limitation.

In this embodiment, the element main body 10 is divided into a voltage input part 11 and a voltage output part 12 with the central point C of a length in a longitudinal direction set as a boundary. The voltage input part 11 and the voltage output part 12 are integrated.

Figure 2:
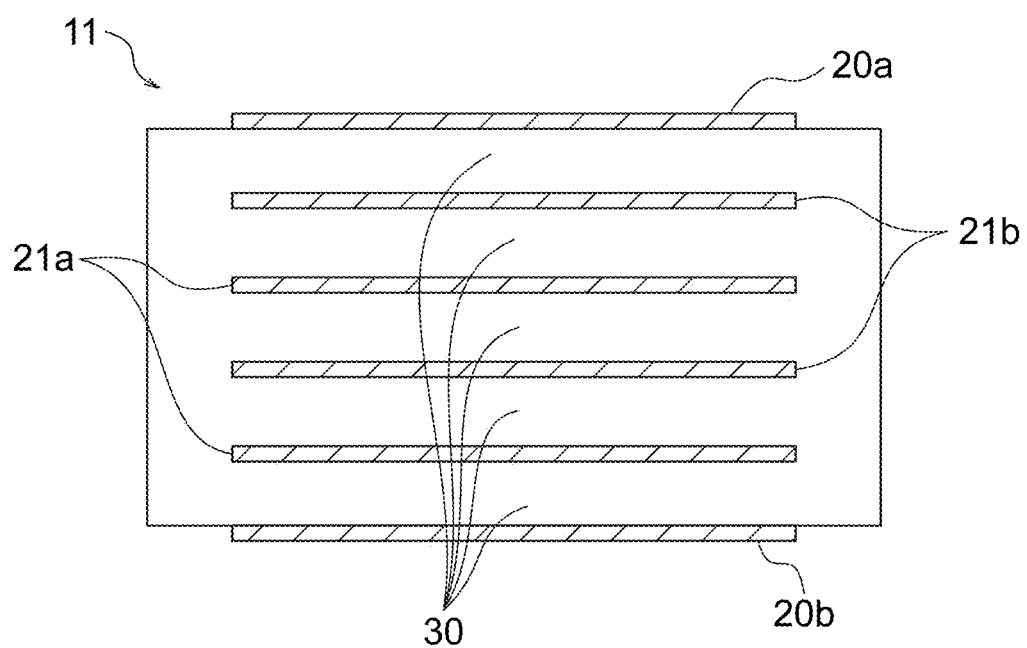
FIG. 2 is a schematic cross-sectional view taken along line II-II shown in FIG. 1.

As shown in FIG. 2, the voltage input part 11 is a stacked body in which piezoelectric layers 30, and internal electrode layers 21a and internal electrode layer 21b are alternately laminated. That is, the piezoelectric transformer 1 is a multilayer piezoelectric transformer. The number of the piezoelectric layers 30 laminated in the voltage input part 11 can be arbitrarily set in correspondence with desired characteristics, uses, and the like without particular limitation. In this embodiment, the piezoelectric layers 30 can be set to one layer to 300 layers. Note that, the piezoelectric layers 30 are located on both main-surface sides of the voltage input part 11, and the number of the internal electrode layers 21a and 21b laminated is determined in correspondence with the number of the piezoelectric layers 30 laminated.

In addition, in the piezoelectric layers 30, an average thickness per one layer (interlayer average thickness) may be arbitrarily set in correspondence with desired characteristics, uses, or the like. In this embodiment, for example, the interlayer average thickness of the piezoelectric layers 30 can be set to 1 to 200 μm, and may be set to 50 to 140 μm. On the other hand, in the internal electrode layers 21a and 21b, an average thickness per one layer may be arbitrarily set, for example, the average thickness can be set to 0.5 to 20 μm, and may be set to 1 to 10 μm in this embodiment.

The internal electrode layers 21a and 21b have the same shape as that of the input electrodes 20a and 20b. When viewed from a laminating direction, the input electrode 20a and the internal electrode layer 21a are disposed to overlap each other, and the input electrode 20b and the internal electrode layer 21b are disposed to overlap each other. In addition, the internal electrode layer 21a and the internal electrode layer 21b are alternately laminated through each of the piezoelectric layers 30.

As shown in FIG. 1, the internal electrode layer 21a is led out to an end surface 10c of the element main body 10 through a lead-out portion 21ac, and is exposed onto the end surface 10c. Similarly, the internal electrode layer 21b is led out to the end surface 10c of the element main body 10 through a lead-out portion 21bd, and is exposed onto the end surface 10c.

The input electrode 20a and the lead-out portion 21ac are electrically connected to each other by a connection electrode 20c, and the input electrode 20b and the lead-out portion 21bd are electrically connected to each other by a connection electrode 20d. That is, the input electrode 20a and the internal electrode layer 21a are electrically connected to each other, and the input electrode 20b and the internal electrode layer 21b are electrically connected to each other. In addition, in this embodiment, the connection electrode 20c and the connection electrode 20d are disposed along a lateral direction of the element main body 10 in line symmetry with respect to a straight line passing through the central point of the length in the lateral direction. And, the connection electrode 20c and the connection electrode 20d are insulated from each other.

In this embodiment, since the voltage input part 11 has the above-described configuration, a voltage can be applied to the piezoelectric layers 30 through the input electrodes 20a, 20b and the internal electrode layers 21a, 21b. Note that, the configuration of the voltage input part 11 is not limited to the configuration shown in FIG. 1, and the input electrode 20a and the internal electrode layer 21a may be electrically connected and the input electrode 20b and the internal electrode layer 21b may be electrically connected so that the input electrode 20a and the input electrode 20b are not short-circuited. For example, the connection electrodes 20c and 20d may be through-hole electrodes passing through the piezoelectric layers 30. In addition, the lead-out portion 21ac and the lead-out portion 21bd may be respectively exposed to side surfaces different from each other in the element main body 10, and may be electrically connected to the connection electrode 20c or the connection electrode 20d.

In addition, the input electrode 20a and the connection electrode 20c are individually described in FIG. 1 and FIG. 2, but may be integrally formed in a manufacturing process. Similarly, the input electrode 20b and the connection electrode 20d may be integrally formed.

The voltage output part 12 is a stacked body in which only the piezoelectric layers 30 are laminated, and an electrode is not formed on main surfaces and at the inside of the voltage output part 12. In this embodiment, in the voltage output part 12, an output electrode 20e is formed on a surface that is opposite to the end surface 10c of the element main body 10, that is, on an end surface 10d of the element main body 10.

In addition, in this embodiment, the voltage input part 11 of the element main body 10 is polarized in a thickness direction of the element, and the voltage output part 12 of the element main body 10 is polarized in a longitudinal direction of the element. In this manner, the voltage input part 11 is configured to include the internal electrode layers 21a and 21b, and the voltage output part 12 is configured to include only the piezoelectric layers 30, the element main body 10 can be used as a piezoelectric transformer.

For example, when an AC voltage is applied to the input electrodes 20a and 20b at a predetermined frequency, first, electric energy is converted into mechanical energy due to the inverse piezoelectric effect in the voltage input part 11, and the voltage input part 11 vibrates. Then, the voltage output part 12 that is integrated with the voltage input part 11 is excited due to the vibration of the voltage input part 11, and thus the voltage output part 12 also vibrates. As a result, in the voltage output part 12, mechanical energy is converted into electric energy due to the piezoelectric effect, and the converted electric energy is output from the output electrode 20e.

Hereinafter, details of respective constituent elements of the piezoelectric transformer 1 are described.

(Internal Electrode Layers 21a and 21b)

All of the internal electrode layers 21a and 21b are constituted mainly by a conductive material. In this embodiment, the conductive material that constitutes the internal electrode layers 21a and 21b is an alloy containing copper (Cu) and at least one selected from palladium (Pd), nickel (Ni), platinum (Pt), gold (Au), and silver (Ag). Examples of the alloy include a Pd—Cu alloy, an Ni—Cu alloy, a Pt—Cu alloy, an Au—Cu alloy, or an Ag—Pd—Cu alloy, and particularly, it is preferable to use the Pd—Cu alloy. In addition, it is preferable that the melting point of the alloy constituting the internal electrode layers 21a and 21b is 850° C. or higher, and more preferably within a range of 1000° C. to 1200° C.

As described above, the internal electrode layers (21a, 21b) contain copper, and it is preferable that the content $C_{IE}$ of Cu contained in the internal electrode layers (21a, 21b) is 1 to 50 at % in terms of a copper element, more preferably within a range of 1 to 15 at %, and still more preferably within a range of 3 to 8 at %. Since $C_{IE}$ is within the above-described range, a dielectric loss of the piezoelectric transformer 1 can be reduced.

Note that, the content $C_{IE}$ of Cu contained in the internal electrode layers (21a, 21b) can be measured by performing quantitative analysis with an inductively coupled plasma emission spectrometer (ICP), or quantitative analysis with an electron probe microanalyzer (EPMA) in cross-section observation using a scanning electron microscope (SEM), a scanning transmission electron microscope (STEM), or the like. That is, the content $C_{IE}$ is expressed by a ratio of Cu elements included in 100 atoms of an internal electrode layer in a predetermined analysis region. With regard to the content $C_{IE}$, it is preferable that the quantitative analysis with the ICP or the EPMA performed at least two times while changing a measurement region (or a sampling site), and the content $C_{IE}$ is calculated as an average value.

In addition, the content $C_{IE}$ can also be measured by X-ray diffraction (XRD) in addition to the quantitative analysis with the ICP or the EPMA. In the case of using the XRD, a lattice constant is calculated by performing peak analysis with respect to an XRD pattern obtained through measurement of 2θ/θ or the like. In addition, the content $C_{IE}$ of copper is calculated from the lattice constant on the basis of Vegard's law.

(Piezoelectric Layer 30)

The voltage output part 12 and the piezoelectric layers 30 of the voltage input part 11 are constituted by a piezoelectric composition capable of obtaining the piezoelectric effect and the inverse piezoelectric effect. Examples of the piezoelectric composition include lead zirconate titanate (PZT: $PbZr_xTi_{1-x}O_3$), alkali metal niobate based compound (KN: $KNbO_3$ or KNN: $(K, Na)NbO_3$), bismuth sodium titanate (BNT: $BiNaTiO_3$), bismuth ferrite (BFO: $BiFeO_3$), BLSF (general formula: $(Bi_2O_2)^{2+}(A_{m-1}B_mO_{3m+1})^{2-}$), and barium sodium niobate (BSN: $Ba_2NaNb_5O_{15}$).

In the piezoelectric layers 30 of this embodiment, it is preferable to contain a composite oxide having a perovskite structure as a main component among the above-described compound. Note that, the main component represents a component that occupies 90 mol % in 100 mol % of piezoelectric composition in this embodiment.

The composite oxide having the perovskite structure is expressed by a general formula $ABO_3$, and PZT, KN, KNN, BNT, and BFO among the above-described component correspond to the composite oxide. In this embodiment, among the composite oxides having the perovskite structure, it is particularly preferable to contain the PZT or the alkali metal niobate based compound such as KN and KNN as the main component. Particularly, the PZT or the alkali metal niobate based compound is excellent in piezoelectric characteristics, and by being contained these as the main component, the performance of the piezoelectric element such as a displacement amount and a drive force is improved.

In this embodiment, it is preferable that the piezoelectric layers 30 contain Cu as an subcomponent in addition to the main component. In the case of containing copper as the subcomponent, an existence aspect of Cu in the piezoelectric layers 30 is not particularly limited, and Cu may be solid-dissolved in grains of main phases constituted by the main component or may exist at grain boundaries. In a case where Cu exists at the grain boundaries, Cu may form a compound with another element.

The content $C_{PE}$ of Cu contained in the piezoelectric layers 30 is preferably 0.5 to 5.0 mol % and more preferably within a range of 1.0 to 4.5 mol % in terms of a copper element. Since the content $C_{PE}$ of Cu in the piezoelectric layers 30 is within the above-described range, the mechanical quality coefficient Qm tends to be improved in the piezoelectric transformer 1 according to this embodiment. In addition, since Cu exists in grains of main phases in the piezoelectric layers 30 and/or at the grain boundaries, a coupling force between the main phases becomes strong, and mechanical strength of the piezoelectric layers 30 can be enhanced.

Further, the content $C_{PE}$ of Cu contained in the piezoelectric layers 30 can be measured by performing quantitative analysis with the ICP or quantitative analysis with the EPMA as in the content $C_{IE}$. That is, the content $C_{PE}$ is expressed as a ratio of Cu elements contained in 100 mol of piezoelectric layer in a predetermined analysis region. Note that, it is preferable that the quantitative analysis with the ICP or the EPMA is performed at least two time while changing a measurement region (or a sampling site), and the content $C_{PE}$ is calculated as an average value.

In addition, in this embodiment, the piezoelectric layers 30 may contain another component as an subcomponent in addition to Cu. For example, as the other subcomponent, the piezoelectric layers 30 may contain at least one kind selected from transition metal elements (element of Group 3 to Group 11 in a long periodic table), elements of Group 2, elements of Group 12, elements of Group 13 in the long periodic table, and germanium (Ge).

Specifically, examples of the transition metal elements other than rare-earth elements include chromium (Cr), manganese (Mn), iron (Fe), cobalt (Co), nickel (Ni), tungsten (W), and molybdenum (Mo). In addition, examples of the rare-earth elements include yttrium (Y), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), and ytterbium (Yb).

Magnesium (Mg) and strontium (Sr) is exemplified as the elements of Group 2, zinc (Zn) is exemplified as the elements of Group 12, and aluminum (Al), gallium (Ga), and indium (In) are exemplified as the elements of group 13.

Note that, it is preferable that the subcomponents other than Cu are added in combination with the Cu subcomponent. In a case where the main component of the piezoelectric layers 30 is the PZT, it is preferable to select Mn, Cr, or Fe among the above subcomponents (other than Cu). On the other hand, in a case where the main component of the piezoelectric layers 30 is the alkali metal niobate based compound, it is preferable to select Ge, Ta, or Zn among the above subcomponents (other than Cu).

(Other Electrodes)

The input electrodes (20a, 20b), the connection electrodes (20c, 20d), and the output electrode 20e may be constituted by a conductive material, and the conductive material is not particularly limited. Examples of the conductive material include gold (Au), silver (Ag), platinum (Pt), palladium (Pd), nickel (Ni), copper (Cu), and tin (Sn), or an alloy containing at least one of the above elements. The conductive material that constitutes the electrodes 20a to 20e may be the same as the alloy constituting the internal electrode layers 21a and 21b. In addition, the electrodes 20a to 20e can be formed by baking paste obtained by mixing a powder of the metal element and a glass powder such as $SiO_2$. Moreover, a plated layer or a sputtering layer that contains the metal element or the like may be formed in an outer layer of each of the electrodes 20a to 20e.

(Element Main Body 10)

As described above, in this embodiment, it is preferable that the internal electrode layers (21a, 21b) contain Cu, and the piezoelectric layers 30 also contain Cu. In this case, the content $C_{LB}$ of Cu contained in the element main body 10 (stacked body) is preferably 1.0 to 5.0 mol %. When the content $C_{LB}$ of Cu with respect to the entirety of the element main body 10 is set within the above-described range, the dielectric loss can be further reduced, and Qm can be further improved.

Here, the "content $C_{LB}$ of copper" represents a ratio of a total number of moles of Cu to a total number of moles (a total amount of substance) of the entirety of the element main body 10, and the total number of moles of Cu is a total sum of the number of moles of Cu contained in the internal electrode layers 21a, 21b and the number of moles of Cu contained in the piezoelectric layers 30. That is, the content $C_{LB}$ also depends on not only the content $C_{IE}$ of Cu contained in the internal electrode layers 21a, 21b and the content $C_{PE}$ of Cu contained in the piezoelectric layers 30, but also the number of layers laminated in each layer or dimensions of each layer (that is, the volume of each layer constituting the stacked body).

More specifically, the content $C_{LB}$ is calculated by the following procedure. First, a total number of moles $N_{IE}$ of the internal electrode layers (21a, 21b), and a total number of moles $N_{PE}$ of the piezoelectric layers 30 are calculated. The total number of moles $N_{IE}$ of the internal electrode layers is calculated on the basis of the following Expression (1) in a state in which the total volume of the internal electrode layers 21a and 21b included in the element main body 10 is set as $V_{IE}$, the theoretical density of the internal electrode layers 21a and 21b is set as $\rho_{IE}$, and the theoretical molecular weight of the internal electrode layers 21a and 21b is set as $M_{IE}$.

$$N_{IE}=V_{IE}\times\rho_{IE}/M_{IE} \quad (1)$$

Similarly, the total number of moles $N_{PE}$ of the piezoelectric layers 30 is calculated by the following Expression (2) in a state in which the total volume of the piezoelectric layers 30 included in the element main body is set as $V_{PE}$, the theoretical density of the piezoelectric layers 30 is set as $\rho_{PE}$, and the theoretical molecular weight of the piezoelectric layers 30 is set as $M_{PE}$.

$$N_{PE}=V_{PE}\times\rho_{PE}/M_{PE} \quad (2)$$

Note that, in Expressions (1) and (2), $\rho_{IE}$ and $M_{IE}$, and $\rho_{PE}$ and $M_{IE}$ are calculated on the basis of the quantitative analysis results with the ICP or the EPMA. For example, in a case where the as the quantitative analysis results of the internal electrode layers, Cu is 4 at % (=4 mol %) and Pd is the remainder (96 at %), $\rho_{IE}$ and $M_{IE}$ are obtained by the following Expression.

$\rho_{IE}$={4 mol %×density of Cu (8.96 g/cm³)}+{96 mol %×density of Pd (12.02 g/cm³)}

$M_{IE}$={4 mol %×atomic weight of Cu (63.5 g/mol)}+ {96 mol %×density of Pd (106.4 g/mol)}

In addition, in Expressions (1) and (2), $V_{IE}$ and $V_{PE}$ are calculated by the number of layers laminated in each layer and dimensions of each layer. Note that, in the case of the piezoelectric transformer 1 shown in FIG. 1, the total volume $V_{PE}$ of the piezoelectric layers 30 is the total sum of the volume of the piezoelectric layers 30 included in the voltage input part 11, and the volume of the piezoelectric layers 30 included in the voltage output part 12.

Then, the content $C_{LB}$ is obtained by substituting the obtained $N_{IE}$ and $N_{PE}$ and the quantitative analysis results (that is, $C_{IE}$ and $C_{PE}$) for the following Expression (3).

$$C_{LB} \text{ (mol \%)}=\{(C_{IE}\times N_{IE}/100)+(C_{PE}\times N_{PE}/100)\}/ \{N_{IE}+N_{PE}\}\times100\% \quad (3)$$

As is clear from Expressions (1) to (3), the content $C_{LB}$ of Cu contained in the entirety of the element main body 10 (stacked body) can be controlled by the composition of the internal electrode layers 21a and 21b, the amount of subcomponent contained in the piezoelectric layers 30, the number of layers laminated in each layer and the dimensions of each layer.

Next, an example of a method for manufacturing the piezoelectric transformer 1 according to this embodiment is described below.

First, a process of manufacturing the element main body 10 is described. In the process of manufacturing the element main body 10, a green sheet that becomes each of the piezoelectric layers 30 after firing, and internal electrode paste that becomes each of the internal electrode layers 21a and 21b after firing are prepared.

For example, the green sheet is manufactured by the following method. First, raw materials of the piezoelectric layer 30 are weighed in a predetermined ratio, and are mixed for 5 to 20 hours by using a mixer such as a ball mill. At this time, as the raw material of the main component, an oxide, carbonate, a hydrogen carbonate compound, or the like can be used. For example, in a case where $KNbO_3$ is set as the main component of the piezoelectric layer 30, a powder of potassium hydrogen carbonate ($KHCO_3$) can be used as a raw material containing K, and a powder of niobium oxide ($Nb_2O_5$) can be used as a raw material containing Nb. In addition, in a case where the piezoelectric layer 30 contains an subcomponent, as a raw material of the subcomponent, a metal simple substance, an oxide, a composite oxide, carbonate, oxalate, acetate, a hydroxide, a halide, an organic metal compound, or the like can be used. For example, in a case where Cu is added as the subcomponent, examples of the raw material of Cu include a Cu simple substance, a copper oxide (CuO or the like), or a composite oxide containing Cu such as $K_\alpha Cu_\beta Ta_\gamma O_\delta$.

The raw materials of the main component and the raw material of the subcomponent are powders, and an average particle size thereof is preferably within a range of 0.1 to 5.0 µm. Note that, the raw material of the subcomponent may be added in the process of mixing the raw materials of the main component, or may be added after calcination to be described later.

In addition, as a mixing method in the process of mixing the raw materials, wet mixing or dry mixing may be used. In the case of performing the wet mixing, a mixed powder obtained after mixing is dried. Moreover, the mixed powder obtained here may be press-molded to a temporarily molded body, and then may be subjected to a calcination treatment described below.

In the calcination treatment, the mixed powder or the temporarily molded body is subjected to a heat treatment in the air under conditions of 750° C. to 1050° C. and 1 to 20 hours to obtain a calcined powder (or a calcined body) of the composite oxide. In a case where the temporarily molded body is calcined, or in a case where the obtained calcined powder is aggregated, for example, the calcined powder is preferably pulverized for a predetermined time by using a pulverizer such as a ball mill to obtain a pulverized powder. An average particle size of the calcined powder that is used in the subsequent process, or an average particle size of the pulverized powder is preferably 0.1 to 5 µm.

In the case of adding the subcomponent after the calcination, the raw material of the subcomponent that is in a predetermined ratio is added to the calcined powder or the pulverized powder to obtain a raw material powder of the piezoelectric composition. As in the mixing of the raw materials of the main component, mixing of the main component and the subcomponent may be performed by various mixers such as a ball mill and a bead mill in wet mixing or dry mixing. In a case where the piezoelectric layer 30 contains Cu as the subcomponent, the content $C_{PE}$ of Cu can be controlled by the addition amount of the raw material of the subcomponent.

Next, a binder and a solvent are added to the raw material powder that is obtained as described above, and the resultant mixture is mixed with a ball mill or the like into slurry, thereby obtaining paste for green sheets. At this time, as the binder that is used, a resin that dissolves in an organic solvent such as an acrylic resin, an ethyl cellulose based resin, and a polyvinyl butyral based resin, or a water-soluble binder such as polyvinyl alcohol, cellulose, and water-soluble acrylic resin can be used. As the solvent, an organic solvent such as ethanol, acetone, terpineol, and butyl carbitol, pure water, or the like can be used. In addition, a plasticizer, a dispersant, or the like may be added in addition to above-described components.

Then, the paste for green sheets is applied onto a resin film such as PET in a predetermined thickness by a method such as a doctor blade, and is appropriately dried, thereby obtaining the green sheet.

On the other hand, the paste for internal electrodes is obtained by kneading a conductive metal powder, a binder, and a solvent into slurry by using a kneader such as a three-piece roll. As the conductive metal powder, a Cu powder, a Pd powder, an Ni powder, a Pt powder, an Au powder, an Ag powder, or the like can be used. Alternatively, a pre-alloyed powder such as a Pd—Cu alloy powder or an Ag—Pd alloy powder can also be used. The internal electrode layers 21a and 21b of this embodiment contain Cu, and the content $C_{IE}$ of Cu can be controlled by a ratio of the Cu powder contained in the paste for internal electrodes.

Note that, in the paste for internal electrodes, an ethyl cellulose based resin, a butyral based resin, an acrylic resin, or the like can be used as the binder, and various alcohols such as terpineol, methyl ethyl ketone (MEK), xylene, or the like can be used as the solvent. Moreover, in addition to the above-described components, a corrosion inhibitor such as benzotriazole, an antistatic agent such as homogenol may be added to the paste for internal electrodes.

A green chip that becomes the element main body 10 is manufactured by using the green sheet and the paste for internal electrodes which are obtained as described above. First, the paste for internal electrodes is printed on the green sheet by various printing methods such as offset printing and screen printing. At this time, a paste application site is adjusted by using a printing mask in which patterns corresponding to the internal electrode layers 21a and 21b are formed, or the like.

Then, the green sheet on which the paste for internal electrodes is printed is laminated in a predetermined order as shown in FIG. 1. At this time, a green sheet on which the paste for internal electrodes is not printed is disposed in a bottom layer and a top layer in a laminating direction. Then, hot pressing is performed with respect to the stacked body to obtain the green chip. In this embodiment, the hot pressing is preferably performed at a pressure of 30 to 300 MPa for 3 to 15 minutes while heating the stacked body at 20° C. to 100° C.

Next, a binder removal treatment is performed for the obtained green chip. As conditions of the binder removal treatment, a holding temperature is preferably set to 400° C. to 800° C., and a temperature holding time is preferably set to 2 to 8 hours.

Next, the green chip after the binder removal treatment is fired. As firing conditions, a holding temperature is preferably set to 950° C. to 1060° C., a temperature holding time is preferably set to 2 to 4 hours, and a temperature raising rate and a temperature lowering rate are preferably set to 50° C./hour to 300° C./hour. Further, an in-furnace atmosphere in firing may be set to a nitrogen atmosphere or a mixed atmosphere of nitrogen and hydrogen, that is, a reducing atmosphere, but an air atmosphere is preferable. Note that, in the case of performing firing in the reducing atmosphere, since a composition of the piezoelectric composition slightly varies, it is preferable to perform re-oxidization treatment after the firing.

In addition, in a case where a Cu component is added to the piezoelectric layer 30 as the subcomponent, the Cu powder may not be added to the paste for internal electrodes. In this case, it is possible to cause Cu contained in the piezoelectric layer 30 (green sheet) to diffuse to the internal electrode layers 21a and 21b by appropriately controlling the firing conditions.

For example, it is preferable to set to a temperature 1060° C. to 1200° C., which is higher than a typical temperature, instantaneously (or for approximately several minutes) before reaching the firing temperature. In this manner, by increasing total thermal energy applied in the firing, Cu on the piezoelectric layer side is likely to diffuse to the internal electrode layer side.

As described above, in the case of controlling the content $C_{IE}$ of Cu contained in the internal electrode layers by causing Cu on the piezoelectric layer side to diffuse, the content $C_{IE}$ becomes within a range of approximately 1.0 to 10 at %. That is, in a case where the content $C_{IE}$ exceeds 10 at %, it is preferable to adjust the amount of Cu contained by adding the Cu powder to the paste for internal electrodes.

The element main body 10 as a sintered body is obtained by the above-described method. The element main body 10 after firing is approximately subjected to a treatment such as polishing and cutting, and then the input electrodes 20a and 20b, the connection electrodes 20c and 20d, and the output electrode 20e are formed in the element main body 10. The electrodes 20a to 20e can be formed by applying and baking the paste for electrodes. Alternatively, the electrodes 20a to 20e may be formed by vapor deposition, sputtering, plating, or the like, and a formation method of the electrodes 20a to 20e is not particularly limited.

Finally, the element main body 10 is subjected to a polarization treatment in oil maintained at a predetermined temperature by applying an electric field of 2 to 5 kV/mm thereto for five minutes to one hour. Note that, the temperature of the oil, the magnitude of the applied electric field, and the like are different in an optimal range in accordance with the main component of the piezoelectric composite. In addition, the voltage input part 11 is subjected to a polarization treatment in a laminating direction of the internal electrodes, and the voltage output part 12 is subjected to the polarization treatment in the longitudinal direction of the element main body 10. According to this, after the polarization treatment, a piezoelectric transformer in which spontaneous polarization is aligned in the laminating direction of the internal electrodes in the voltage input part 11, and the spontaneous polarization is aligned in the longitudinal direction of the element main body in the voltage output part 12 is obtained.

Note that, description has been given of the procedure of obtaining one piece of the element main body 10, but a green sheet in which a plurality of internal electrode patterns are formed in one sheet may be used. Aggregated stacked bodies formed by using the sheet are appropriately cut before firing or after firing. According to this, a plurality of the elements as shown in FIG. 1 is finally obtained.

(Summary of this Embodiment)

In the piezoelectric element (piezoelectric transformer 1) according to this embodiment, the internal electrode layers 21a and 21b included in the element main body 10 are constituted by an alloy containing Cu. In addition, the content $C_{IE}$ of Cu contained in the internal electrode layers 21a and 21b is 1.0 to 50 at %. In this manner, the dielectric loss can be reduced by adjusting the amount of Cu contained in the internal electrode layers.

Here, the dielectric loss is one of main characteristics determining the performance of the piezoelectric element. For example, when applying an electric field to the piezoelectric element, some of electric energy supplied is consumed as heat energy in correspondence with the magnitude of the dielectric loss. That is, in mutual conversion between electric energy and mechanical energy, when the dielectric loss is large, conversion efficiency decreases. Typically, the dielectric loss is measured as dielectric tangent tan δ (unit: %) by using an impedance analyzer or the like, and it is determined that the smaller a value of tan δ is, the smaller the dielectric loss is and the more the performance is satisfactory. In the piezoelectric element of this embodiment, a predetermined of Cu is contained in the internal electrode layers, and thus tan δ at a measurement frequency of 1 kHz can be reduced to be less than 10%.

The reason why the dielectric loss is reduced is not clear. However, for example, the following reason is considered. In the case of using a typical Pd electrode or Ag—Pd alloy electrode as internal electrodes in a piezoelectric element, it is considered that an internal electrode layer and a piezoelectric layer may not be sufficiently adhered to each other, and a gap peeling may occur and thus the dielectric loss increases due to the gap or the like. In the piezoelectric element of this embodiment, since a predetermined amount of Cu is contained in the internal electrode layer, it is considered that adhesiveness between the internal electrode layer and the piezoelectric layer is improved. As a result of the improvement in the adhesiveness, occurrence of the gap or the peeling between the internal electrode layer and the piezoelectric layer is suppressed, and thus it is considered that the dielectric loss can be reduced.

Additionally, in the piezoelectric element of this embodiment, the piezoelectric layers 30 also contain Cu, and the content $C_{PE}$ of Cu contained in the piezoelectric layers 30 is 1.0 to 4.5 mol %. In this manner, since the piezoelectric layers 30 contain Cu, it is considered that occurrence of a leak current in the polarization treatment can be suppressed, and spontaneous polarization of the piezoelectric layers 30 proceeds sufficiently. As a result, the dielectric loss can be further reduced, and the mechanical quality coefficient Qm can be further raised.

Moreover, in the piezoelectric element of this embodiment, the content $C_{LB}$ of Cu contained in the entirety of the element main body 10 (stacked body) is 1.0 to 5.0 mol %. When the content $C_{LB}$ is within the above-described range, the dielectric loss can be further reduced, and Qm can be further improved.

Modification Example

Note that, in this embodiment, the piezoelectric transformer 1 has been described as an example of the piezoelectric element, but the piezoelectric element of the invention is applicable to a piezoelectric actuator, a piezoelectric buzzer, a piezoelectric speaker, an ultrasonic motor, a sensor, and the like in addition to the piezoelectric transformer. For example, a piezoelectric element 100 shown in FIG. 3 can be used as a piezoelectric actuator.

Figure 3:
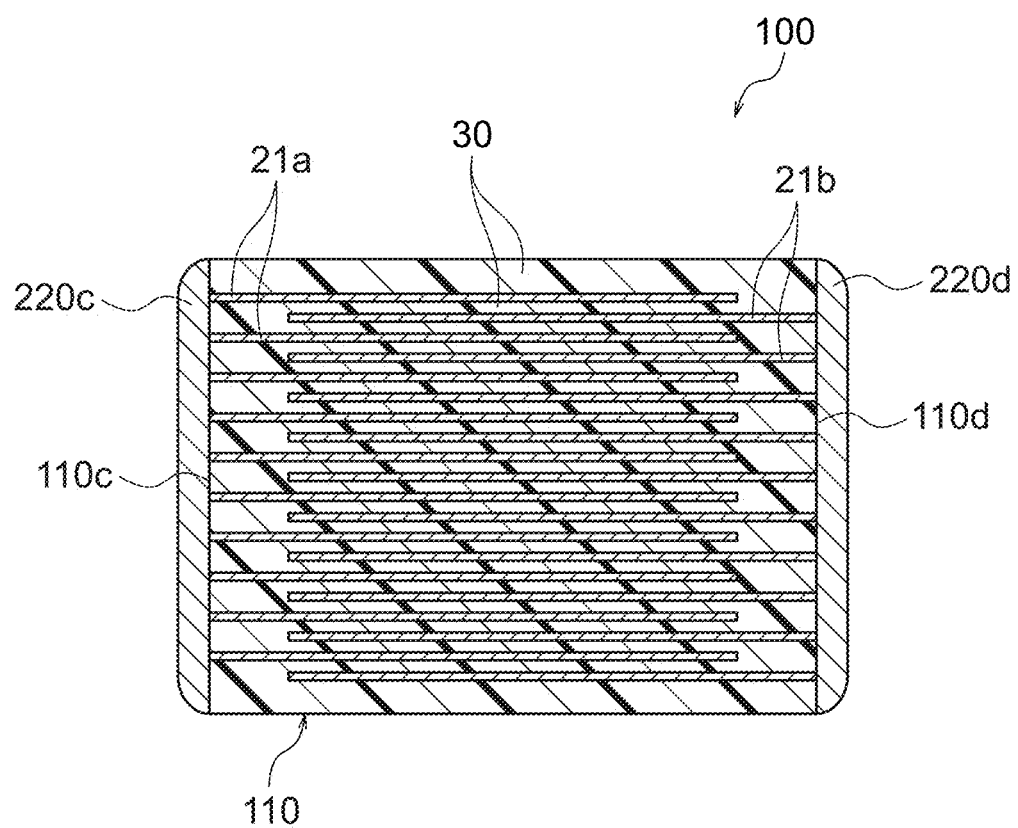
FIG. 3 is a schematic cross-sectional view illustrating a modification example of the piezoelectric element (piezoelectric actuator) according to the present embodiment.

The piezoelectric element 100 shown in FIG. 3 does not have a configuration corresponding to the voltage output part 12 in the piezoelectric transformer 1 in FIG. 1, and the piezoelectric layers 30 and the internal electrode layers 21a, 21b are alternately laminated in an element main body 110. In addition, end portions of the internal electrode layers 21a and 21b are respectively exposed to end surfaces 110c and 110d of the element main body 110, and electrical connection with terminal electrodes 220c and 220d is established at the exposed end portions. An external power supply or an external circuit is connected to the terminal electrodes 220c and 220d through a wire (not illustrated) or the like, and thus the piezoelectric element 100 functions as the piezoelectric actuator.

Note that, even in the piezoelectric element 100, an average thickness of the piezoelectric layers 30 and the number of the piezoelectric layers 30 laminated can be set in a similar manner as in the above-described embodiment. In addition, an average thickness of the internal electrode layers 21a, 21b and the number of the internal electrode layers 21a, 21b laminated in the piezoelectric element 100 can be set in a similar manner as in the above-described embodiment.

In addition, even in the piezoelectric element 100, by controlling the contents $C_{IE}$, $C_{PE}$, and $C_{LB}$ of Cu within a predetermined range, a similar effect as in the above-described embodiment is obtained. In addition, in the piezoelectric actuator including the piezoelectric element 100, a minute displacement is obtained with accuracy with respect to an applied voltage, and a response speed is high. Accordingly, the piezoelectric actuator can be used, for example, as a drive device for optical parts, a head drive device for HDDs, a head drive device for inkjet printers, a drive device for fuel injection valves, and haptics devices.

Hereinbefore, the embodiment of the present invention has been described, but the present invention is not limited to the embodiment, and various modifications can be made within the scope of the present invention.

EXAMPLES

Hereinafter, the present invention is described in more detail with reference to examples and comparative examples. However, the present invention is not limited to the following examples.

Example 1

In Example 1, the piezoelectric element 100 shown in FIG. 3 was manufactured in the following procedure, and the dielectric tangent tan δ and the mechanical quality coefficient Qm of samples obtained were measured.

First, a powder of potassium hydrogen carbonate ($KHCO_3$) and a powder of niobium oxide ($Nb_2O_5$) were prepared as raw materials of the piezoelectric composition, and were weighed to obtain a predetermined composition ($KNbO_3$) after firing. In addition, the raw materials were wet mixed by a ball mill for 16 hours, and were dried at 120° C. to obtain a mixed powder. Next, the obtained mixed powder was press molded, was calcined at 1000° C. for 4 hours to obtain a calcined body of a composite oxide. In addition, the calcined body was pulverized by a ball mill for 16 hours to obtain a pulverized powder.

In Example 1, a binder and a solvent were added to the obtained pulverized powder (raw material powder) without adding an subcomponent, and the resultant mixture was mixed by a ball mill to prepare paste for green sheets. At this time, a polyvinyl butyral resin was used as the binder, and 10 parts by weight of binder was added to 100 parts by weight of raw material powder (the pulverized powder). In addition, MEK was used as the solvent, and 100 parts by weight of MEK was added to 100 parts by weight of raw material powder. Further, in Example 1, 5 parts by weight of dibutyl phthalate (DOP) was added to 100 parts by weight of raw material powder as a plasticizer.

Moreover, in addition to the configuration, paste for internal electrodes was prepared by using a Pd powder and Cu powder. Specifically, the Pd powder and the Cu powder were weighed in a predetermined ratio, and ethyl cellulose (binder) and terpineol (solvent) and benzotriazole (corrosion inhibitor) were added to the resultant mixture. The mixture was kneaded by a three-piece roll to prepare Pd—Cu alloy paste. At this time, with regard to the amount of each component added with respect to 100 wt % of paste, the binder was set to 3 wt %, the solvent was set to 52 wt %, and the corrosion inhibitor was set to 0.4 wt %.

Next, the paste for green sheets was applied onto a PET film in a predetermined thickness, and was dried to obtain a green sheet. In addition, the Pd—Cu alloy paste was printed onto the green sheet in a predetermined pattern and was peeled off from the PET film to obtain a green sheet on which an internal electrode pattern was printed. Next, a plurality of the green sheets was laminated in a predetermined order. In addition, green sheets in which the electrode pattern is not formed are laminated as a bottom layer and a top layer in a laminating direction, and the green sheets were pressure-bonded to obtain a green chip.

A binder removal treatment was performed for the green chip obtained as described above. The binder removal treatment was performed under an air atmosphere in a state in which a holding temperature was set to 550° C. and a temperature holding time was set to 2 hours. Next, the green chip after the binder removal treatment was fired in an air atmosphere under conditions of 1050° C. and two hours to obtain a stacked body (sintered body) sample.

Next, silver paste was printed on two end surfaces of a stacked body that was obtained, and was baked at 800° C. to form terminal electrodes. Finally, a polarization treatment was performed in silicone oil maintained at 150° C. by applying an electric field of 3 kV/mm to the stacked body after formation of the terminal electrodes for five minutes, thereby obtaining a piezoelectric element sample according to Example 1.

Note that, although not described, in Examples 1, the stacked body of the green sheets was prepared as aggregated stacked bodies, and the aggregated stacked bodies were cut before the binder removal treatment to prepare 30 pieces of piezoelectric element samples. In addition, in the piezoelectric element sample in Example 1, the piezoelectric layers had an average thickness of 20 μm, and the internal electrode layer had an average thickness of 2 μm and the number of layers laminated was 10. In addition, a cross-section of the obtained piezoelectric element sample was observed with a SEM. At this time, quantitative analysis of the piezoelectric layers and the internal electrode layers was performed with EPMA to measure $C_{IE}$, $C_{PE}$, and $C_{LB}$ in the piezoelectric element sample of Example 1. As a result, results shown in Table 1 were obtained. Note that, in Table 1, $C_{other}$ represents the content of components other than Cu contained in the internal electrode layers.

(Evaluation of Characteristics)

In addition, tan δ and Qm of the piezoelectric element sample according to Example 1 were measured by an impedance analyzer (4194A) manufactured by Hewlett Packard Enterprise Development LP. Note that, tan δ was measured under conditions of a measurement voltage of 100 mV and a measurement frequency of 1 kH. In this example, a reference value of tan δ was set to 10% or less, 6% or less was judged to be good, and 4% or less was judged to be even better. On the other hand, with regard to Qm, 290 was set as a reference value, 1000 or greater was judged to be good, and 2000 or greater was judged to be even better.

Examples 2 to 6

In Examples 2 to 6, at the time of preparing the Pd—Cu alloy paste, experiments were performed while changing a ratio of the Pd powder and the Cu powder to prepare piezoelectric element samples in which $C_{IE}$ is different from Example 1. Results obtained by measuring $C_{IE}$, $C_{PE}$, and $C_{LB}$ of Examples 2 to 6 with EPMA are shown in Table 1. In addition, in Examples 2 to 6, other experimental conditions other than the above-described conditions were set to be similar as in Example 1, and then tan δ and Qm of respective piezoelectric element samples were measured.

Comparative Example 1 and Comparative Example 2

In Comparative Examples 1 and 2, when preparing the Pd—Cu alloy paste, experiments were performed while changing a ratio of the Pd powder and the Cu powder to prepare piezoelectric element samples in which $C_{IE}$ is different from Example 1. Other experimental conditions other than the above-described conditions were set to be similar as in Example 1, and then tan δ and Qm of the piezoelectric element samples according to Comparative Examples 1 and 2 were measured.

Examples 7 to 10

In Examples 7 to 10, the composition of the Pd—Cu alloy paste was changed and Cu was added to the piezoelectric layers as the subcomponent to prepare piezoelectric element samples in which $C_{IE}$ and $C_{PE}$ were different from Example 1. Note that, in Examples 7 to 10, a pulverized powder that was pulverized after calcination and CuO were mixed by a ball mill for 16 hours, and the resultant mixture was dried at 120° C. to obtain a raw material powder for piezoelectric layers. In addition, $C_{PE}$ in Examples 7 to 10 was controlled by the amount of CuO added. Other experimental conditions other than the above-described conditions were set to be similar as in Example 1, and then tan δ and Qm of the piezoelectric element samples according to Examples 7 to 10 were measured.

Examples 11 to 13

In Examples 11 to 13, experiments were performed while changing the average thickness of the piezoelectric layers included in the stacked body and the average thickness of the internal electrode layers included in the stacked body to prepare piezoelectric element samples in which a range of $C_{LB}$ is different from Examples 1 to 10. $C_{IE}$, $C_{PE}$, and $C_{LB}$ in Examples 11 to 13 are shown in Table 1.

was within a range of 1.0 to 50 at %, tan δ was lower in comparison to Comparative Examples 1 and 2, and thus the dielectric loss could be reduced. In addition, in Examples 1 to 6, Qm was further improved in comparison to Comparative Examples 1 and 2, and thus the reference value of Qm could be satisfied.

Figure 4:
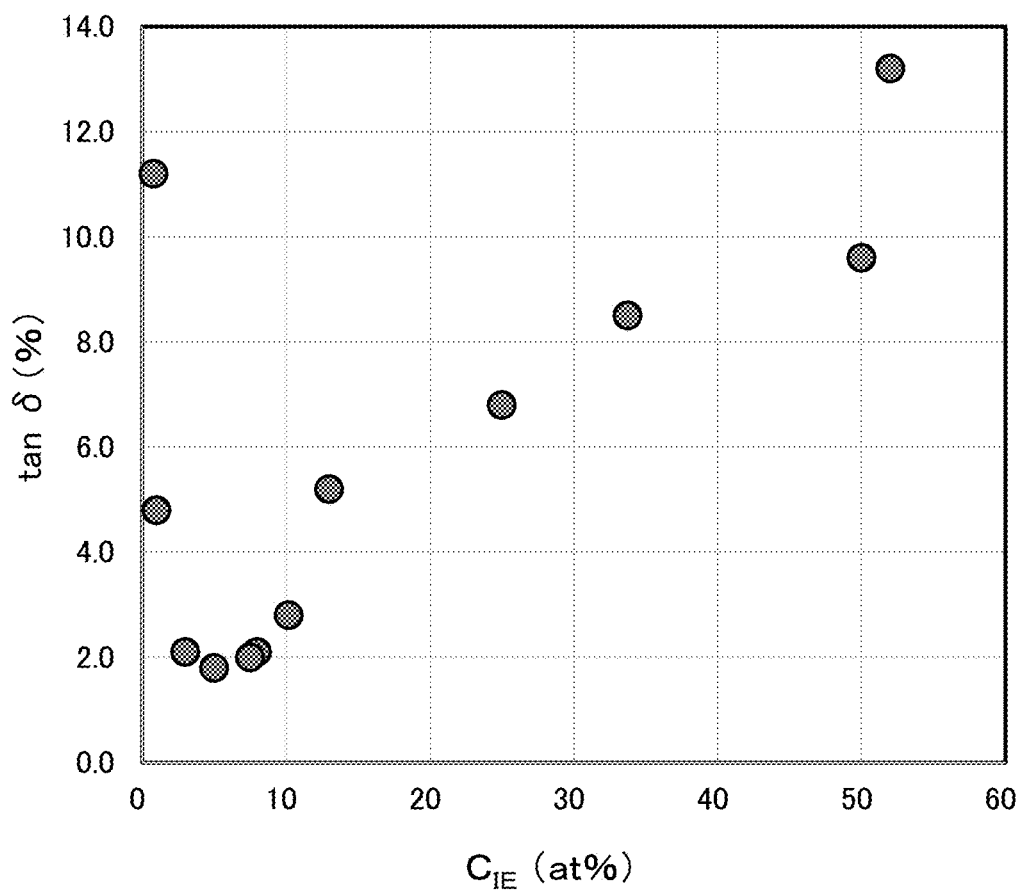
FIG. 4 is a graph showing evaluation results of examples.

In addition, FIG. 4 is a graph obtained by plotting measurement results of tan δ with respect to $C_{IE}$ on the basis of evaluation results of Comparative Examples 1 and 2, and Examples 1 to 10. From the results in FIG. 4, it could be confirmed that the dielectric loss can be reduced in a case where $C_{IE}$ was 1.0 to 50 at %, and it could be confirmed that $C_{IE}$ is preferably 1.0 to 15 at %, and more preferably 3 to 8 at %.

Figure 5:
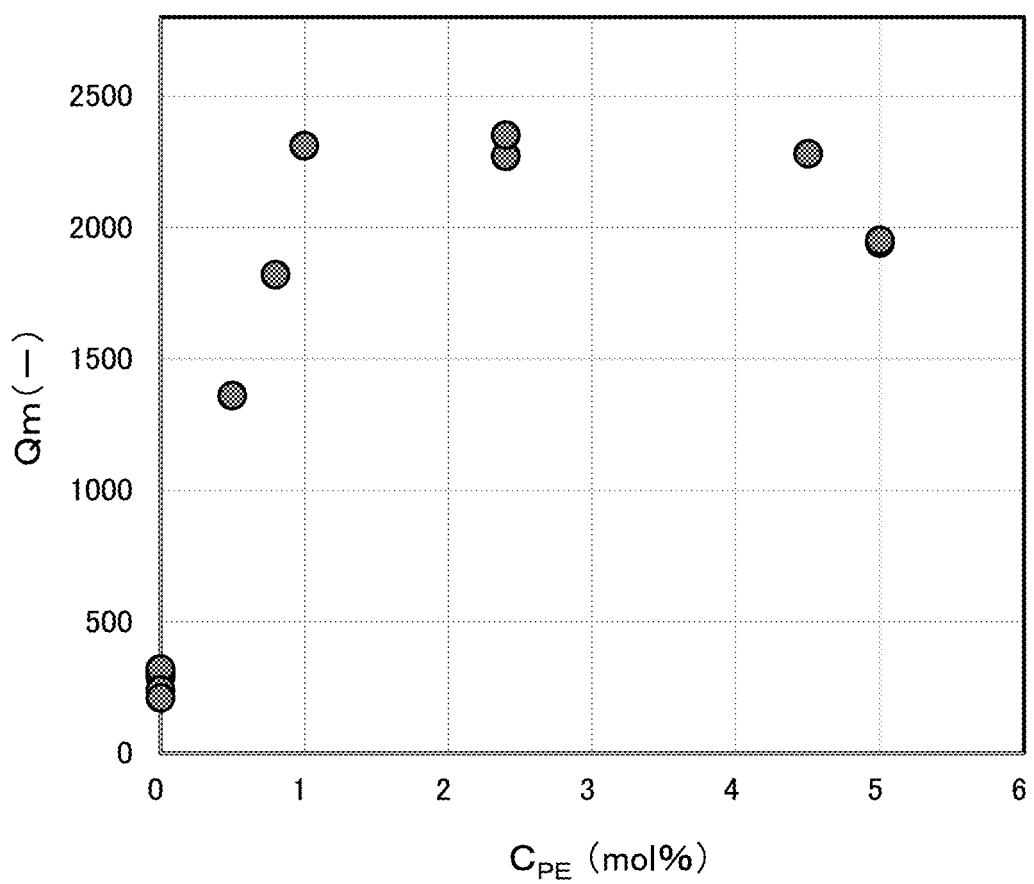
FIG. 5 is a graph showing evaluation results of examples.

In addition, when comparing Examples 1 to 6, and Examples 7 to 10 with each other, it could be seen that when Cu is also contained in the piezoelectric layers, Qm is significantly improved. FIG. 5 shows results obtained by plotting measurement results of Qm with respect to $C_{PE}$ on the basis of evaluation results of Comparative Examples 1 and 2, and Examples 1 to 13. From results in FIG. 5, it could be confirmed that Qm becomes as high as 2000 or greater in a case where $C_{PE}$ is within a range of 1 to 4.5 mol %.

In addition, when comparing Examples 1 to 6 and Examples 11 to 13 with each other, it can be seen that tan δ is further reduced and Qm is improved in a case where $C_{LB}$ is within a range of 1 to 5 mol %. In addition, when comparing Examples 7 to 10 and Examples 11 and 12 with each other, it can be seen that evaluation results in Examples 11 and 12 are particularly satisfactory. From the results, in a case where $C_{IE}$, $C_{PE}$, and $C_{LB}$ satisfy preferred ranges, that is, $C_{IE}$ is within a range of 1.0 to 50 at %, $C_{PE}$ is within a

TABLE 1

| Sample No. | Piezoelectric layer Main composition | Internal electrode layer Main composition | Content of Cu | | | Evaluation result | |
| --- | --- | --- | --- | --- | --- | --- | --- |
| | | | Internal electrode layer $C_{Other}$ at % | $C_{IE}$ at % | Piezoelectric layer $C_{PE}$ mol % | Stacked body $C_{LB}$ mol % | tan δ % | Qm |
| Comparative Example 1 | KNbO$_3$ | Pd—Cu alloy | 99.2 | 0.8 | 0.0 | 0.1 | 11.2 | 240 |
| Comparative Example 2 | KNbO$_3$ | Pd—Cu alloy | 48.0 | 52.0 | 0.0 | 0.5 | 13.2 | 210 |
| Example 1 | KNbO$_3$ | Pd—Cu alloy | 99.0 | 1.0 | 0.0 | 0.1 | 4.8 | 300 |
| Example 2 | KNbO$_3$ | Pd—Cu alloy | 95.0 | 5.0 | 0.0 | 0.05 | 1.8 | 320 |
| Example 3 | KNbO$_3$ | Pd—Cu alloy | 92.0 | 8.0 | 0.0 | 0.1 | 2.1 | 290 |
| Example 4 | KNbO$_3$ | Pd—Cu alloy | 87.0 | 13.0 | 0.0 | 0.1 | 5.2 | 310 |
| Example 5 | KNbO$_3$ | Pd—Cu alloy | 75.0 | 25.0 | 0.0 | 0.2 | 6.8 | 290 |
| Example 6 | KNbO$_3$ | Pd—Cu alloy | 50.0 | 50.0 | 0.0 | 0.5 | 9.6 | 320 |
| Example 7 | KNbO$_3$ | Pd—Cu alloy | 92.5 | 7.5 | 0.5 | 0.9 | 2.0 | 1360 |
| Example 8 | KNbO$_3$ | Pd—Cu alloy | 97.0 | 3.0 | 0.8 | 0.9 | 2.1 | 1820 |
| Example 9 | KNbO$_3$ | Pd—Cu alloy | 66.3 | 33.8 | 4.5 | 5.4 | 8.5 | 2280 |
| Example 10 | KNbO$_3$ | Pd—Cu alloy | 89.8 | 10.2 | 5.0 | 5.1 | 2.8 | 1940 |
| Example 11 | KNbO$_3$ | Pd—Cu alloy | 70.0 | 30.0 | 1.0 | 1.0 | 1.3 | 2310 |
| Example 12 | KNbO$_3$ | Pd—Cu alloy | 95.5 | 4.5 | 2.4 | 2.5 | 1.7 | 2270 |
| Example 13 | KNbO$_3$ | Pd—Cu alloy | 70.0 | 30.0 | 5.0 | 5.0 | 6.3 | 1950 |

(Evaluation Result 1)

In Comparative Example 1, since $C_{IE}$ was less than 1.0 at %, tan δ was large, and the reference value of the dielectric loss could not be satisfied. In addition, in Comparative Example 1, Qm was small, and the reference value of Qm could not be satisfied. In Comparative Example 2, since $C_{IE}$ exceeded 50 at %, as in Comparative Example 1, the reference value of tan δ and the reference value of Qm could not be satisfied. In contrast, in Examples 1 to 6 in which $C_{IE}$ range of 1 to 4.5 mol %, and $C_{LB}$ is within a range of 1 to 5 mol %, it could be confirmed that tan δ is further reduced, and Qm is also further improved.

Example 21

In Example 21, the internal electrode layers were constituted by an Au—Cu alloy to prepare a piezoelectric element sample. In Example 21, other experimental conditions other than the above-described condition were set to be similar as in Example 1.

Example 22

In Example 22, an experiment was performed without adding the Cu powder to the paste for internal electrodes, thereby preparing a piezoelectric element sample. Note that, in Example 22, Cu contained in the piezoelectric layers was caused to diffuse into the internal electrode layers by changing the firing conditions from the conditions in Example 1. Specifically, in Example 22, in the firing, a temperature was set to 1060° C. higher in comparison to Example 1, and was held for one minute. Then, the temperature was lowered to 1050° C. and was held for two hours as is. In addition, in Example 22, experimental conditions other than the conditions were set to be similar as in Example 12.

Examples 23 to 26

In Examples 23 and 24, the main component of the piezoelectric layers was constituted by KNN ((K, Na)NbO$_3$) to prepare piezoelectric element samples. In addition, in Examples 25 and 26, the main component of the piezoelectric layers was constituted by PZT (Pb(Zr, Ti)O$_3$) to prepare piezoelectric element samples. Note that, experimental conditions in Examples 23 and 25 are common to Example 12 and experimental conditions of Examples 24 and 26 are common to Example 11 except that the main component of the piezoelectric layers is changed.

Evaluation results of Examples 21 to 26 are shown in Table 2.

From the results of Examples 23 to 26, it could be confirmed that even when changing the main component constituting the piezoelectric layers, when $C_{IE}$, $C_{PE}$, and $C_{LB}$ are within predetermined ranges, tan δ can be reduced, and Qm is improved. In addition, when comparing Examples 11 and 12, and Examples 23 to 26 with each other, it could be understood that when the main component of the piezoelectric layers is KNN or PZT, the reduction effect of tan δ and the improvement effect of Qm are further enhanced.

NUMERICAL REFERENCES

1 . . . Piezoelectric transformer
10 . . . Element main body
11 . . . Voltage input part
20a, 20b . . . Input electrode
20c, 20d . . . Connection electrode
21a, 21b . . . Internal electrode layer
21ac, 21bd . . . Lead-out portion
30 . . . Piezoelectric layer
12 . . . Voltage output part
20e . . . Output electrode
100 . . . Piezoelectric element
110 . . . Element main body
220c, 220d . . . Terminal electrode

What is claimed is:
1. A piezoelectric element comprising:
a stacked body including a piezoelectric layer and an internal electrode layer laminated to each other,
wherein the internal electrode layer contains copper and at least one selected from palladium, nickel, platinum, gold, and silver,

TABLE 2

| | Piezoelectric layer | Internal electrode layer | Content of Cu | | | | Evaluation result | |
|---|---|---|---|---|---|---|---|---|
| | | | | Internal | Piezoelectric | Stacked | | |
| | Main | Main | | electrode layer | layer | body | | |
| Sample No. | composition | composition | $C_{Other}$ at % | $C_{IE}$ at % | $C_{PE}$ mol % | $C_{LB}$ mol % | tan δ % | Qm |
| Example 21 | KNbO$_3$ | Au—Cu alloy | 99.0 | 1.0 | 0.0 | 0.1 | 4.7 | 310 |
| Example 22 | KNbO$_3$ | Pd—Cu alloy | 95.5 | 4.5 | 2.4 | 2.5 | 0.9 | 2350 |
| Example 23 | KNN | Pd—Cu alloy | 95.5 | 4.5 | 2.4 | 2.5 | 0.4 | 2410 |
| Example 24 | KNN | Pd—Cu alloy | 70.0 | 30.0 | 1.0 | 1.0 | 5.6 | 2430 |
| Example 25 | PZT | Pd—Cu alloy | 95.5 | 4.5 | 2.4 | 2.5 | 0.3 | 2470 |
| Example 26 | PZT | Pd—Cu alloy | 70.0 | 30.0 | 1.0 | 1.0 | 5.2 | 2520 |

From results of Example 21, it could be confirmed that even when changing the kind of an alloy constituting the internal electrode layers, when $C_{IE}$, $C_{PE}$, and $C_{LB}$ are within predetermined ranges, tan δ can be reduced, and Qm is improved.

From results of Example 22, it could be confirmed that even in the case of causing Cu to diffuse from the piezoelectric layers to the internal electrode layers, when $C_{IE}$ is within a predetermined range, tan δ can be reduced. In addition, when comparing Example 22 and Example 12 shown in Table 1 with each other, evaluation results in Example 22 are more satisfactory in comparison to Example 12. As a result, it could be seen that tan δ can be further reduced and Qm is further improved when Cu is caused to diffuse from the piezoelectric layer in comparison to a case where the Cu powder is added to the paste for internal electrodes.

the content of copper contained in the internal electrode layer is 1 to 50 at % in terms of a copper element, and
the piezoelectric layer contains an alkali metal niobate based oxide.
2. The piezoelectric element according to claim 1,
wherein the piezoelectric layer contains copper, and
the content of copper contained in the piezoelectric layer is 1.0 to 4.5 mol % in terms of a copper element.
3. The piezoelectric element according to claim 1,
wherein a total content of copper contained in the stacked body is 1.0 to 5.0 mol % in terms of a copper element.
4. The piezoelectric element according to claim 2,
wherein a total content of copper contained in the stacked body is 1.0 to 5.0 mol % in terms of a copper element.
5. A piezoelectric actuator comprising:
the piezoelectric element according to claim 1.

6. A piezoelectric transformer comprising:
the piezoelectric element according to claim 1.

* * * * *